United States Patent
Wada et al.

(10) Patent No.: US 7,960,254 B2
(45) Date of Patent: Jun. 14, 2011

(54) MANUFACTURING METHOD FOR EPITAXIAL WAFER

(75) Inventors: Naoyuki Wada, Tokyo (JP); Makoto Takemura, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/645,744

(22) Filed: Dec. 23, 2009

(65) Prior Publication Data

US 2010/0159679 A1   Jun. 24, 2010

(30) Foreign Application Priority Data

Dec. 24, 2008 (JP) ................. 2008-327274

(51) Int. Cl.
*H01L 21/20* (2006.01)
*C23C 16/00* (2006.01)

(52) U.S. Cl. . 438/478; 438/503; 438/607; 257/E21.461; 257/E21.463; 118/715; 118/725; 118/728; 118/729; 118/620; 118/50; 118/50.1; 118/641

(58) Field of Classification Search .................. 438/478, 438/403; 257/E21.461, E21.463
See application file for complete search history.

(56) References Cited

U.S. PATENT DOCUMENTS

| | | | |
|---|---|---|---|
| 2003/0119283 A1* | 6/2003 | Ishibashi et al. | 438/478 |
| 2007/0227441 A1* | 10/2007 | Narahara et al. | 117/84 |
| 2009/0127672 A1 | 5/2009 | Kinbara | |
| 2009/0205562 A1 | 8/2009 | Wada | |

FOREIGN PATENT DOCUMENTS

JP        2006-5164        1/2006

OTHER PUBLICATIONS

English language Abstract of JP 2006-5164, Jan. 5, 2006.

* cited by examiner

*Primary Examiner* — Ha Tran T Nguyen
*Assistant Examiner* — Aaron A Dehne
(74) *Attorney, Agent, or Firm* — Greenblum & Bernstein, P.L.C.

(57) ABSTRACT

To provide a manufacturing method for an epitaxial wafer that alleviates distortions on a back surface thereof due to sticking between a wafer and a susceptor, thereby preventing decrease in flatness thereof due to a lift pin. A manufacturing method for an epitaxial wafer according to the present invention includes: an oxide film forming step in which an oxide film is formed on a back surface thereof; an etching step in which a hydrophobic portion exposing a back surface of the semiconductor wafer is provided by partially removing the oxide film; a wafer placing step in which the semiconductor wafer is placed; and an epitaxial growth step in which an epitaxial layer is grown on a main surface of the semiconductor wafer; and the diameter of the lift pin installation circle provided on a circle on a bottom face of a susceptor is smaller than that of the hydrophobic portion.

7 Claims, 6 Drawing Sheets

FIG. 7A
FIG. 7B
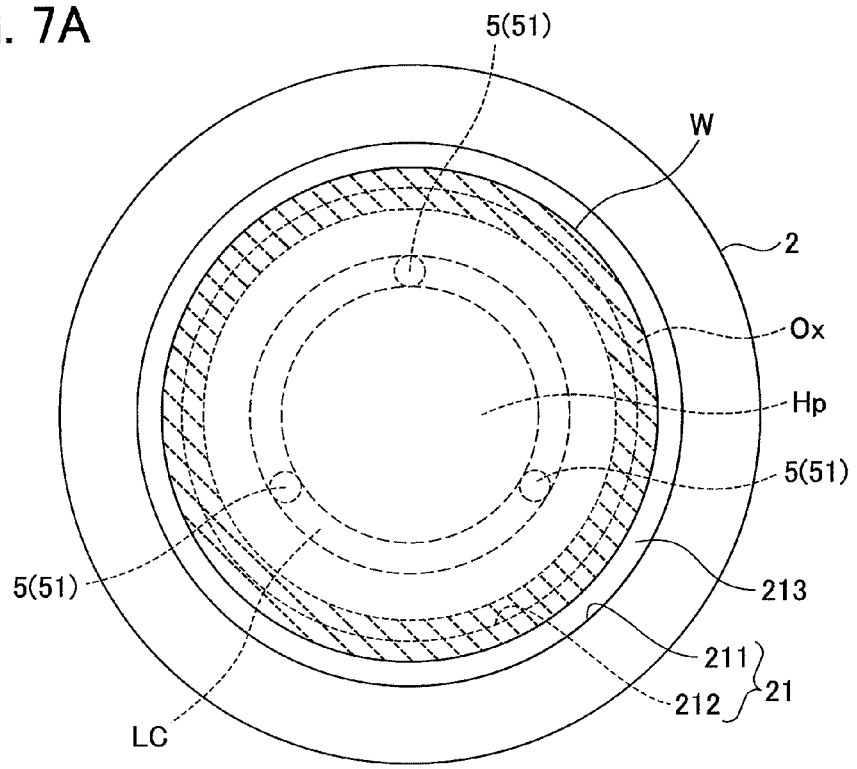
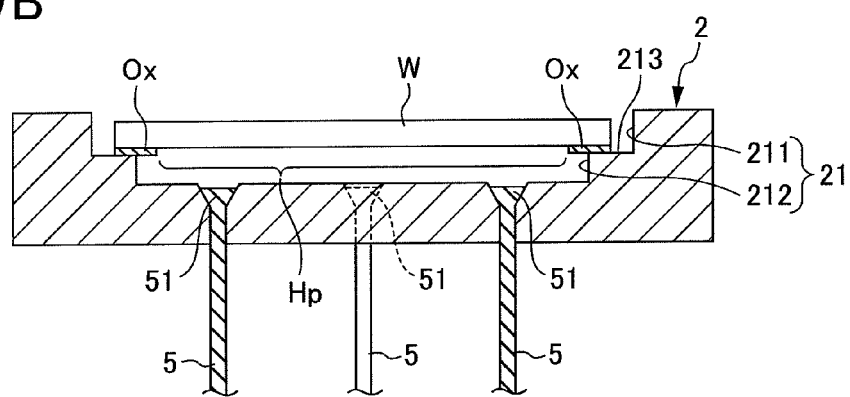

MANUFACTURING METHOD FOR EPITAXIAL WAFER

This application is based on and claims the benefit of priority from Japanese Patent Application No. 2008-327274, filed on 24 Dec. 2008, the content of which is incorporated herein by reference.

BACKGROUND OF THE INVENTION

1. Field of the Invention

The present invention relates to a manufacturing method for an epitaxial wafer using a vapor phase growth system.

2. Related Art

An epitaxial wafer is a semiconductor wafer in which an epitaxial layer is grown on a main surface thereof. Recently, there is a demand for epitaxial wafers having high flatness and high definition is required accompanying increased integration of semiconductor devices and design rule miniaturization (miniaturized pattern). A vapor phase growth system that grows an epitaxial layer on a main surface of a semiconductor wafer is used for manufacturing an epitaxial wafer.

With the vapor phase growth system, an epitaxial layer can be grown on a main surface of a semiconductor wafer according to the following steps, for example. First, a semiconductor wafer is placed on a disk-shaped susceptor provided inside a reaction container. Here, an upper face of the susceptor is a concave shaped wafer-placing portion. The reaction container used is configured so that reactant gas can be supplied thereinto. Thereafter, the semiconductor wafer is heated by a heater disposed on an outer surface of the reaction container in order to react the semiconductor wafer with the reactant gas that passes through the inside of the reaction container, thereby growing an epitaxial layer on a main surface of the semiconductor wafer.

However, in growing the epitaxial layer on the main surface of the semiconductor wafer, the epitaxial layer tends to be grown in an outer peripheral portion of a back surface of the semiconductor wafer. In a case where an epitaxial layer is formed between the semiconductor wafer and the susceptor, contact trace of the susceptor (sticking) may remain in the outer peripheral portion of the back surface of the semiconductor wafer.

Furthermore, if such sticking occurs between the back surface of the semiconductor wafer and the susceptor, distortions on the back surface of the semiconductor wafer may be generated due to difference in thermal expansion between the semiconductor wafer and the susceptor when temperature of the heater rises and falls and when the heater is in a high temperature state. Such distortions may lead to pattern displacement in a random orientation, which is difficult to correct, in thermal processing before the photolithography processing of the semiconductor wafer, in a production process of a semiconductor device. There has been a problem in that such pattern displacement further leads to misalignment in photolithography processing.

Given this, a method is proposed for evaluating a surface configuration of an epitaxial wafer by measuring surface configuration of a main surface and a back surface of the epitaxial wafer along a radial direction thereof, calculating a reference line from a predetermined region in surface configuration data thus measured, and obtaining a local slope representing a difference between the reference line and the surface configuration data in a thickness direction (for example, see Japanese Unexamined Patent Application Publication No. 2006-5164).

However, Japanese Unexamined Patent Application Publication No. 2006-5164 discloses only a method for evaluating the surface configuration of an epitaxial wafer and does not disclose a concrete method for alleviating distortions on a back surface of the epitaxial wafer.

Under such circumstances, the present inventors found that distortions on a back surface of the epitaxial wafer can be alleviated by forming a silicon oxide film in advance on the back surface of a semiconductor wafer on which an epitaxial layer is to be grown, and have utilized this as a method for improving a manufacturing method for an epitaxial wafer.

Here, a lift pin used for attaching and detaching a semiconductor wafer or an epitaxial wafer (hereinafter may be collectively referred to simply as wafer) is embedded in a bottom face of a concave shaped wafer placement portion on a top face of the susceptor. The lift pin has a head portion having a larger diameter and is disposed such that the head portion is hung on a tapered side wall portion of a through hole provided on the bottom face of the wafer placement portion. If the susceptor is lowered and a lower portion of the lift pin contacts the bottom face of the reaction container, the lift pin is biased and the head portion thereof hits the back surface of the wafer, thereby lifting the wafer from the wafer placement portion.

As described above, the lift pin is a component required to detach the wafer from the wafer placement portion of the susceptor. However, the lift pin is generally formed of a material having a thermal conductivity different from that of the susceptor, leading to a nonuniform temperature distribution on a surface of a wafer placed on the susceptor. According to a result of a manufacturing test conducted by the present inventors, it was ascertained that SFQR (Site flatness Front side least sQuare fit Range), in other words a flatness, of an epitaxial wafer decreases in a case where, with such a nonuniform temperature distribution on the surface of the wafer, epitaxial growth is performed as described above by growing a silicon oxide film on the whole back surface of a semiconductor wafer. In this case, SFQR significantly decreases only in a site where the lift pin was present on the back surface of the epitaxial wafer. As described above, an epitaxial wafer with high flatness and high definition is required accompanying design rule miniaturization and the like. Therefore, such an epitaxial wafer, of which flatness is low in parts thereof, is a factor contributing to a lower yield in manufacturing of semiconductor devices.

The present invention is made in view of the abovementioned problems, and aims at providing a manufacturing method for an epitaxial wafer that can alleviate distortions on a back surface thereof due to sticking between a wafer and a susceptor, thereby preventing decrease in flatness of the epitaxial wafer due to presence of a lift pin.

SUMMARY OF THE INVENTION

The present inventors have conducted an intensive research and found that the abovementioned problems can be solved by providing a semiconductor oxide film on an entire back surface of a semiconductor wafer that is to be epitaxially grown, and then partially removing the oxide film in a round shape that is concentric with the semiconductor wafer, in other words, by leaving the semiconductor oxide film in an outer peripheral portion where sticking with the susceptor is likely to occur and removing the semiconductor oxide film in a site that is positioned above the lift pin when housed at a wafer placement portion.

A manufacturing method for an epitaxial wafer according to the present invention uses a vapor phase growth system that is provided with a susceptor, the susceptor having on an upper face thereof a substantially round and concave shaped wafer placement portion, on which a semiconductor wafer is placed and, on a bottom face thereof, a plurality of through holes through which lift pins that move the semiconductor wafer up and down is inserted, on a lift pin installation circle that is concentric with the wafer placement portion, and includes: an oxide film forming step in which a hydrophilic portion consisting of an oxide film is formed on a back surface of the semiconductor wafer; an etching step in which a hydrophobic portion that exposes a back surface of the semiconductor wafer is provided by removing a portion of the oxide film in a circular shape that is concentric with the semiconductor wafer, after the oxide film forming step; a wafer placing step in which the semiconductor wafer is placed on the wafer placement portion so that the back surface of the semiconductor wafer faces downward after the etching step; and an epitaxial growth step in which an epitaxial layer is grown on a main surface of the semiconductor wafer after the wafer placing step, in which the diameter of the lift pin installation circle is smaller than the diameter of the hydrophobic portion.

The hydrophilic portion is preferably provided on the back surface of the semiconductor wafer, at least in a site that is in contact with the wafer placement portion.

The wafer placement portion is preferably composed of a first concave portion that has a round shape and is concave downward from the upper face of the susceptor, and a second concave portion that is concave downward from a bottom face of the first concave portion and has a round shape that is concentric with and has a smaller diameter than the first concave portion; a semiconductor wafer supporting portion for supporting the semiconductor wafer on the bottom face of the first concave portion is preferably formed at a position on an outer periphery side of the second concave portion; the through holes are preferably provided on a bottom face of the second concave portion; and in the wafer placing step, the semiconductor wafer is preferably placed on the wafer supporting portion so that an outer peripheral portion of a back surface of the semiconductor wafer is supported by the semiconductor wafer supporting portion.

The hydrophilic portion is preferably provided on the back surface of the semiconductor wafer at least between a circle that is concentric to the semiconductor wafer, located 5 mm inward from an outer peripheral edge thereof, and the outer peripheral edge.

According to the present invention, there is provided a manufacturing method for an epitaxial wafer that can alleviate distortions on a back surface thereof due to sticking between a wafer and a susceptor, thereby preventing decrease in flatness of the epitaxial wafer due to a lift pin being present.

BRIEF DESCRIPTION OF THE DRAWINGS

FIGS. 4A and 4B are diagrams showing a semiconductor wafer W before forming an oxide film on a back surface W2 thereof, in which FIG. 4A is a bottom view and FIG. 4B is a vertical cross-sectional view;

FIGS. 5A and 5B are diagrams showing the semiconductor wafer W in which an oxide film Ox is formed on an entirety of the back surface W2 thereof, in which FIG. 5A is a bottom view and FIG. 5B is a vertical cross-sectional view;

FIGS. 6A and 6B are diagrams showing the semiconductor wafer W in which an oxide film Ox is formed in an outer peripheral portion of the back surface W2 thereof, in which FIG. 6A is a bottom view and FIG. 6B is a vertical cross-sectional view; and FIGS. 7A and 7B are diagrams showing a state where the semiconductor wafer W is placed on the susceptor 2, in which FIG. 7A is a plan view and FIG. 7B is a vertical cross-sectional view.

DETAILED DESCRIPTION OF THE INVENTION

Figure 1:
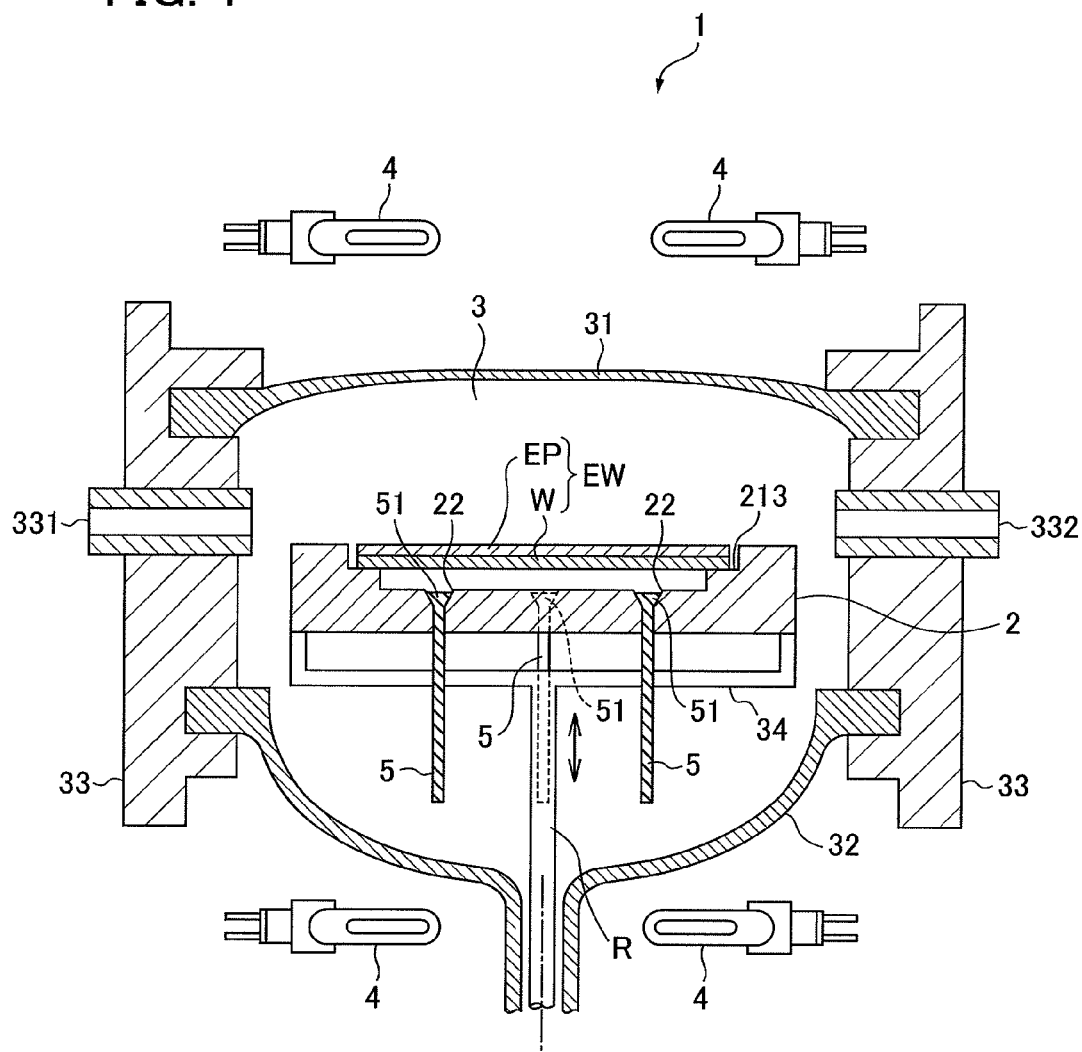
FIG. 1 is a cross-sectional view schematically showing a vapor phase growth system used in an embodiment of a manufacturing method for an epitaxial wafer according to the present invention.
Figure 2A:
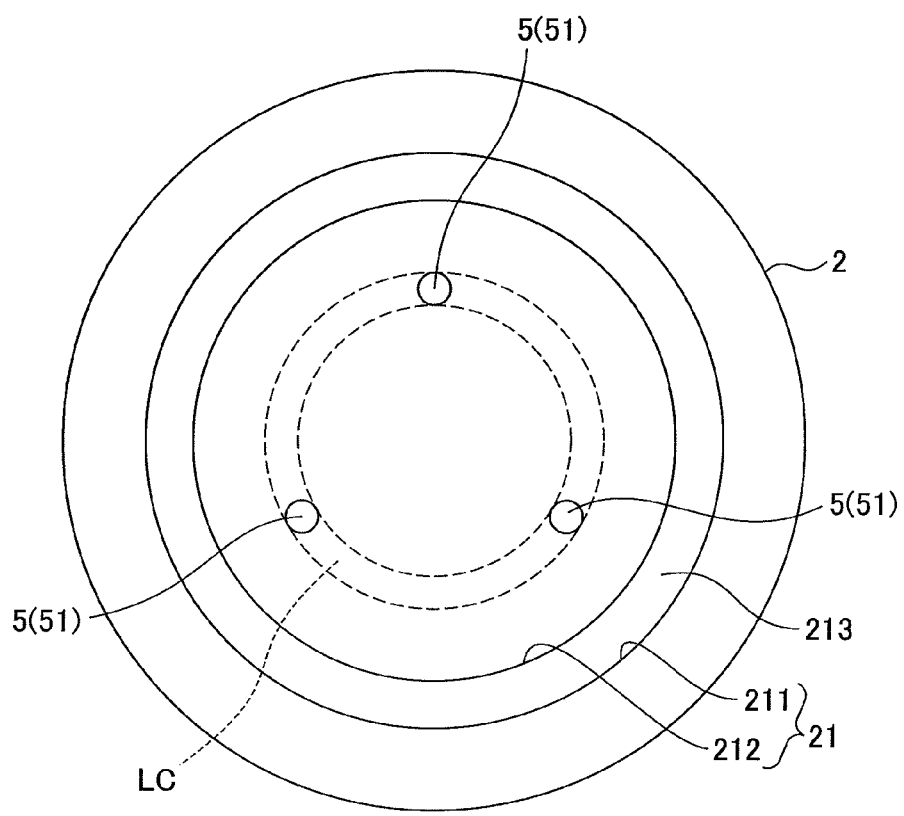
FIG. 2A is a plan view showing a susceptor used in the embodiment of the manufacturing method for an epitaxial wafer according to the present invention.
Figure 2B:
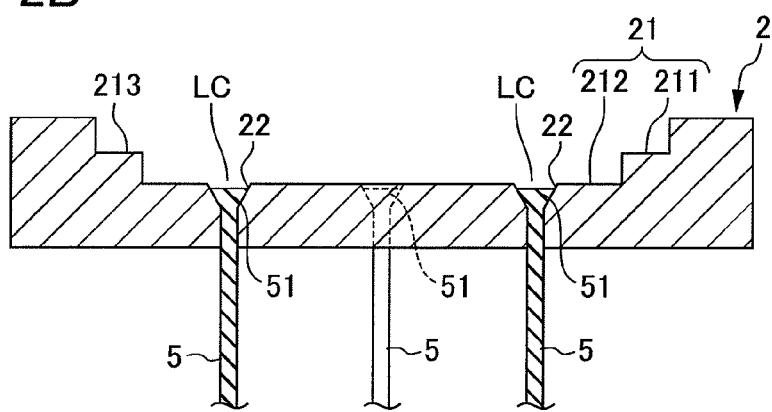
FIG. 2B is a vertical cross-sectional view of the susceptor.

An embodiment of the manufacturing method for an epitaxial wafer according to the present invention is hereinafter described with reference to the drawings. FIG. 1 is a cross-sectional view schematically showing a vapor phase growth system used in the embodiment of the manufacturing method for an epitaxial wafer according to the present invention. FIG. 2A is a plan view showing a susceptor used in the embodiment of the manufacturing method for an epitaxial wafer according to the present invention. FIG. 2B is a vertical cross-sectional view of the susceptor.

Vapor Phase Growth System

First, a vapor phase growth system used in the embodiment of the manufacturing method for an epitaxial wafer according to the present invention is described. As shown in FIG. 1, a vapor phase growth system 1 according to the present embodiment is a device for manufacturing an epitaxial wafer EW by vapor-phase growing an epitaxial layer EP on a main surface of a semiconductor wafer W composed of a silicon wafer. The vapor phase growth system 1 includes a susceptor 2, a reaction container 3, a heating device 4, and a lift pin 5.

The reaction container 3 includes a susceptor 2 thereinside, and is configured so that reactant gas can be supplied thereinto. The reaction container 3 makes the epitaxial layer EP grow on the main surface of the semiconductor wafer W by supplying the reactant gas to the semiconductor wafer W placed on the susceptor 2. The reaction container 3 includes an upper dome 31, a lower dome 32, a dome attaching body 33, and a susceptor supporting portion 34.

The upper dome 31 and the lower dome 32 are composed of a translucent member such as quartz.

The dome attaching body 33 is composed of a substantially cylindrical member with upper and lower ends that are open, and supports the upper dome 31 and the lower dome 32 by upper and lower opening portions.

A reactant gas supply pipe 331 is provided on a lateral face of the dome attaching body 33. A reactant gas outlet pipe 332 is provided on a lateral face, which is opposite to the reactant gas supply pipe 331, of the dome attaching body 33. The reactant gas supply pipe 331 and the reactant gas outlet pipe 332 are formed to communicatively connect the inside and the outside of the reaction container 3.

Reactant gas is supplied from the reactant gas supply pipe 331 into the reaction container 3. The reactant gas is obtained by, for example, attenuating an Si source of $SiHCl_3$ with hydrogen gas and mixing a minute amount of dopant gas therewith. The reactant gas thus supplied passes horizontally through the main surface of the semiconductor wafer W that is placed on the susceptor 2, and then is discharged to the outside of the reaction container 3 through the reactant gas outlet pipe 332.

The susceptor 2 is a member on which the semiconductor wafer W is placed, and disposed inside the reaction container 3. The susceptor 2 is supported at a lower surface thereof by the susceptor supporting portion 34 that extends from a rotational axis R, and is rotated by the rotational axis R being driven. In addition, the susceptor 2 moves up and down according to movement up and down of the susceptor supporting portion 34. Material of the susceptor 2 is not particularly limited, and may preferably be a carbon substrate coated with a SiC film.

As shown in FIGS. 1 and 2, a wafer placement portion 21 that is constituted of a substantially round concave portion having a diameter greater than that of the semiconductor wafer W is formed on an upper face of the susceptor 2. Here, "substantially round" is not limited to a perfect circle and includes an elliptical shape and a shape similar to a perfect circle. The wafer placement portion 21 is constituted of a first concave portion 211 and a second concave portion 212. The first concave portion 211 is a concave portion that has a round shape and is concave downward from an upper face of the susceptor 2. The second concave portion 212 is a concave portion that is concave downward from a bottom face of the first concave portion 211 and has a round shape that is concentric with and has a smaller diameter than the first concave portion 211. In addition, in the susceptor 2, a wafer supporting portion 213 for supporting the semiconductor wafer W on the bottom face of the first concave portion 211 is formed at a position on an outer periphery side of the second concave portion 212.

The semiconductor wafer W is placed inside the wafer placement portion 21 while being supported by the wafer supporting portion 213. It should be noted that the wafer supporting portion 213 can be configured to be declivitous from a peripheral side of the first concave portion 211 toward a peripheral side of the second concave portion 212 so as to support the outer peripheral portion of the semiconductor wafer W by line contact, or can be provided unevenly on an upper face of the wafer supporting portion 213 so as to support the outer peripheral portion of the semiconductor wafer W by point contact.

For loading and unloading the semiconductor wafer W into and from the susceptor 2, the lower surface of the semiconductor wafer W is supported by a lift pin 5 and the semiconductor wafer W is moved up and down according to movement up and down of the lift pin 5.

The lift pin 5 is embedded in the susceptor 2. The lift pin 5 has a head portion 51 having a larger diameter and is disposed such that the head portion 51 is hung on a tapered side wall portion of a through hole 22 provided on the bottom face of the second concave portion 212 of the wafer placement portion 21 onto which the semiconductor wafer W is to be placed.

The semiconductor wafer W is attached and detached by the lift pin 5, with movement up and down of the susceptor 2. For example, for detaching the semiconductor wafer W from the susceptor 2, the susceptor 2 is moved down and a tail portion of the lift pin 5 is brought into contact with the lower dome 32 of the reaction container 3. The lift pin 5 thus biased hits the back surface of the semiconductor wafer W at the head portion 51, thereby lifting the semiconductor wafer W above the wafer placement portion 21. Thereafter, a handler (not shown) is inserted between the susceptor 2 and the semiconductor wafer W, and the semiconductor wafer W is lifted in a state of being supported by the handler. The semiconductor wafer W is transported to a next process in a state of being supported by the handler.

As shown in FIG. 1, the susceptor supporting portion 34 is composed of a translucent member such as quartz. The susceptor supporting portion 34 projects toward the inside of the reaction container 3 from a substantially central portion of the lower dome 32 of the reaction container 3 so as to horizontally support the susceptor 2 inside the reaction container 3. In addition, the susceptor supporting portion 34 is, for example, configured to be rotatable about the rotational axis R and ascendable and descendable in a vertical direction of the rotational axis R under control of a control device (not shown).

The heating device 4 is provided on each of upper and lower sides of the reaction container 3. The heating device 4 heats the susceptor 2 and the semiconductor wafer W placed thereon by radiative heat via the upper dome 31 and the lower dome 32 of the reaction container 3, thereby setting the semiconductor wafer W to a predetermined temperature. For example, a halogen lamp, an infrared lamp and the like can be adopted as the heating device 4. In addition to radiative heating, a radio-frequency heating system that heats the semiconductor wafer W by induction heating can be adopted for the heating device 4.

Manufacturing Method for Epitaxial Wafer

Figure 3:
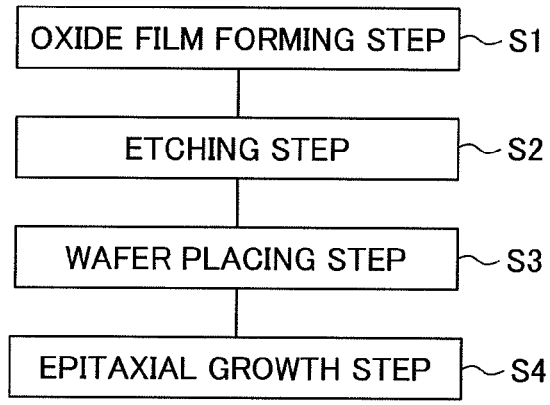
FIG. 3 is a process flow diagram showing a process in the embodiment of the manufacturing method for an epitaxial wafer according to the present invention.
Figure 4A:
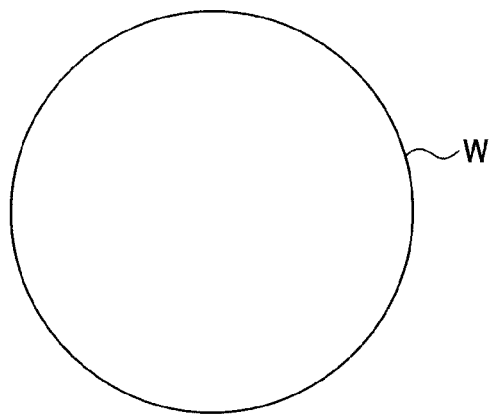
Figure 4B:
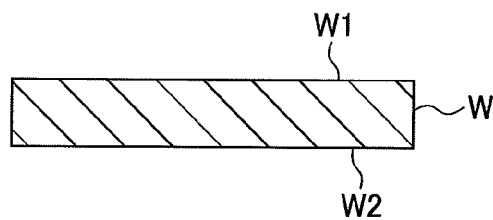
Figure 5A:
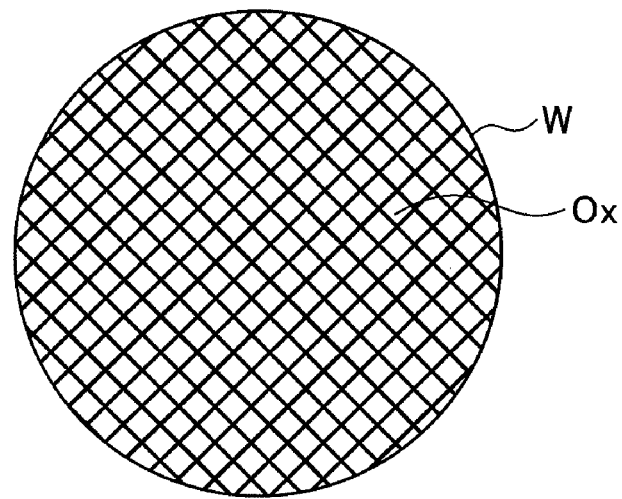
Figure 5B:
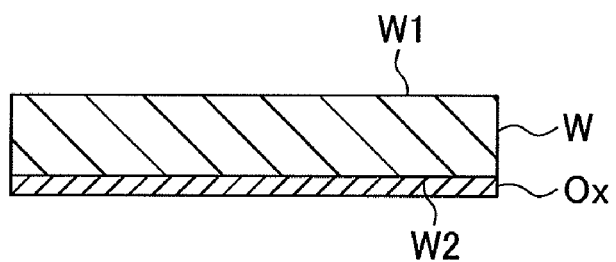
Figure 6A:
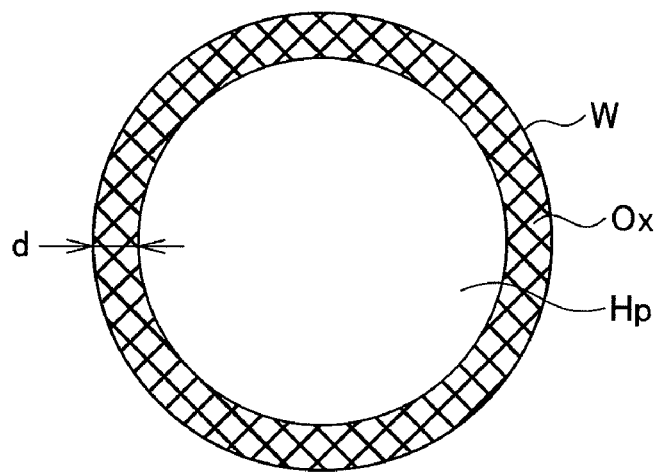
Figure 6B:
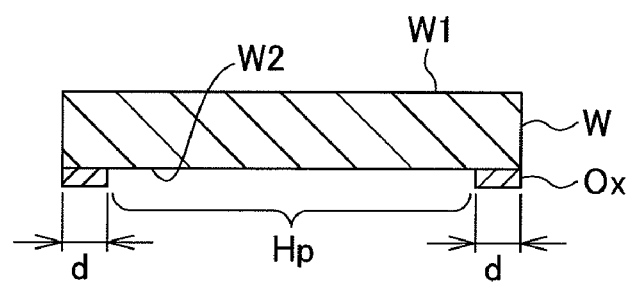

Next, an embodiment of the manufacturing method for an epitaxial wafer according to the present invention is hereinafter described. FIG. 3 is a process flow diagram showing a process in the embodiment of the manufacturing method for an epitaxial wafer according to the present invention. FIGS. 4A and 4B are diagrams showing a semiconductor wafer W before forming an oxide film on a back surface W2 thereof, in which FIG. 4A is a bottom view and FIG. 4B is a vertical cross-sectional view. FIGS. 5A and 5B are diagrams showing the semiconductor wafer W in which an oxide film Ox is formed on an entirety of the back surface W2 thereof, in which FIG. 5A is a bottom view and FIG. 5B is a vertical cross-sectional view. FIGS. 6A and 6B are diagrams showing the semiconductor wafer W in which an oxide film Ox is formed in an outer peripheral portion of the back surface W2 thereof, in which FIG. 6A is a bottom view and FIG. 6B is a vertical cross-sectional view.

The manufacturing method for an epitaxial wafer according to the present embodiment includes: an oxide film forming step S1 in which a hydrophilic portion consisting of an oxide film Ox is formed on a back surface W2 of the semiconductor wafer W; an etching step S2 in which a hydrophobic portion Hp that exposes a back surface W2 of the semiconductor wafer W provided by removing a portion of the oxide film Ox in a circular shape that is concentric with the semiconductor wafer W after the oxide film forming step S1; a wafer placing step S3 in which, after the etching step S2, the semiconductor wafer W is placed on a semiconductor wafer supporting portion 213 inside the wafer placement portion 21 so that the back surface W2 of the semiconductor wafer W faces downward; and an epitaxial growth step S4 in which, after the wafer placing step S3, an epitaxial layer is grown on a main surface W1 of the semiconductor wafer W.

The semiconductor wafer W used in the present embodiment is obtained by slicing a silicon single crystal ingot so as to have a predetermined thickness, before the oxide film forming step S1 described hereinafter. Diameter of the semiconductor wafer W is, for example, 200 mm, 300 mm, 450 mm or the like. Surfaces of the semiconductor wafer W thus obtained are etched, and then the main surface W1 and the back surface W2 of the semiconductor wafer W are mirrorfinished. Thereafter, as described later, the oxide film forming step S1, the etching step S2, the wafer placing step S3, and the epitaxial growth step S4 are performed.

Oxide Film Forming Step (S1)

First, the oxide film forming step S1 of the present embodiment is described. The oxide film forming step S1 is a step for forming a hydrophilic portion consisting of the oxide film Ox on the entire back surface W2 of the semiconductor wafer W. More specifically, the back surface W2 of the semiconductor wafer W as shown in FIG. 4 is processed using an oxidant chemical and the oxide film Ox is formed on the entire back surface W2 of the semiconductor wafer W as shown in FIG. 5.

The oxide film Ox is formed by processing by an oxidant chemical, using batch cleaning equipment, a single wafer processing cleaner and the like. The oxidant chemical (hereinafter also referred to simply as chemical) is not particularly limited as long as the chemical can form the oxide film Ox on the back surface of the semiconductor wafer W. Such a chemical includes ozone water obtained by including ozone in pure water, cleaning solutions having oxidizing properties such as SC (Standard Cleaning)-1 solution, SC-2 solution, $HF—HNO_3$ solution, $HF—H_2O_2$ solution and the like. It should be noted that the SC-1 solution is a mixed liquid in which $NH_4OH$, $H_2O_2$, and $H_2O$ are mixed in a proportion of 1:1:5. On the other hand, the SC-2 solution is a mixed liquid in which HCl, $H_2O_2$, and $H_2O$ are mixed in a proportion of 1:1:5.

The oxide film Ox provided on the back surface W2 of the semiconductor wafer W can be provided also on the main surface W1 as necessary. In this case, the oxide film Ox can be simultaneously provided on the back surface W2 and the main surface W1 or separately on the back surface W2 and the main surface W1.

By the oxide film forming step S1, for example in a case where the semiconductor wafer W is a silicon wafer, the back surface W2 of the semiconductor wafer W is changed from hydrophobic silicon (Si) to hydrophilic silicon oxide ($SiO_2$). Here, water contact angle with respect to the back surface W2 of the semiconductor wafer W is preferably no greater than 20° and more preferably no greater than 10°. With the water contact angle with respect to the back surface W2 of the semiconductor wafer W that is no greater than the abovementioned value, sticking between the semiconductor wafer W and the susceptor 2 can be efficiently prevented, thereby inhibiting distortions in an outer peripheral portion of an epitaxial wafer EW, in the epitaxial growth step S4 (described later). It should be noted that, in a case where a natural oxide film or the like is present on the back surface W2 of the semiconductor wafer W and the water contact angle with respect to the back surface W2 of the semiconductor wafer W is already the abovementioned value before the oxide film forming step S1, the subsequent etching step S2 can be preformed considering the oxide film forming step S1 already performed.

In addition, a temperature of the chemical in forming the oxide film on the semiconductor wafer W is preferably an ambient temperature of up to 90° C. The water contact angle with respect to the back surface W2 of the semiconductor wafer W can be appropriately changed by adjusting concentration of the chemical, processing time, temperature of the chemical and the like.

Etching Step (S2)

Next, the etching step S2 of the present embodiment is described. The etching step S2 is a step for removing a part of the hydrophilic portion consisting of the oxide film Ox, provided on the back surface W2 of the semiconductor wafer W in the oxide film forming step S1, in a circular shape that is concentric with the semiconductor wafer W as shown in FIG. 6. By the etching step S2, the hydrophilic portion consisting of the oxide film Ox, provided on the back surface W2 of the semiconductor wafer W, is removed except for in an outer peripheral portion of the semiconductor wafer W.

The etching step S2 is performed by processing the back surface W2 of the semiconductor wafer W by an etching solution that is caustic to an oxide of semiconductor (such as $SiO_2$) using a batch cleaning equipment, for example. The batch cleaning equipment used here is provided with a rotating means that rotates the semiconductor wafer W and can discharge the etching solution from a chemical discharging mechanism provided in the vicinity of the center of the back surface W2 of the semiconductor wafer, while rotating the semiconductor wafer W. The etching solution discharged in the vicinity of the center of the back surface W2 of the semiconductor wafer W moves from a central portion toward the outer peripheral portion of the semiconductor wafer W, spreading in a circle concentric with the semiconductor wafer W, according to rotation of the semiconductor wafer W. The hydrophilic portion consisting of the oxide film Ox, provided in an inner periphery of the semiconductor wafer W, is thus removed in a circular shape concentric with the semiconductor wafer W. As a result, a surface of the hydrophobic semiconductor (for example, Si), which is present below the oxide film Ox, is exposed.

As described above, the oxide film Ox provided on the back surface W2 of the semiconductor wafer W is not fully removed by the etching solution, but removed only in the inner peripheral portion of the semiconductor wafer W by the etching solution and remains in the outer peripheral portion of the semiconductor wafer W. In order to thus remove the oxide film Ox that is provided on the back surface W2 of the semiconductor wafer W, rotating speed of the semiconductor wafer W in the batch cleaning equipment is set to be lower than that in a normal cleaning step. The rotating speed of the semiconductor wafer W can be accordingly set based on conditions such as size of the oxide film Ox remaining in the outer peripheral portion of the semiconductor wafer, spraying amount of the etching solution, viscosity of the etching solution, and the like. The size of the oxide film Ox to remain in the outer peripheral portion of the semiconductor wafer W is described later.

The etching solution for removing the oxide film provided on the back surface W2 of the semiconductor wafer W can be any solution that is caustic to an oxide of semiconductor (such as $SiO_2$), and not particularly limited. As the etching solution, a hydrofluoric acid (HF) water solution can be exemplified. Concentration of the hydrofluoric acid (HF) water solution used as the etching solution is preferably in a range of 0.1 to 10.0% by mass and more preferably in a range of 0.5 to 5.0% by mass.

As already described, by removing the hydrophilic portion consisting of the oxide film Ox, the hydrophobic semiconductor (for example, Si), which is present below the oxide film Ox, is exposed, thereby forming the hydrophobic portion Hp. Since the water contact angle in the hydrophobic portion Hp is greater than that in the hydrophilic portion consisting of the oxide film Ox, a removal depth of the oxide film Ox by the etching solution can be determined by measuring the water contact angle of the surface of the semiconductor. The water contact angle of the back surface W2 of the semiconductor wafer after removal of the oxide film Ox is preferably greater than 20° and more preferably no less than 30°. By configuring the contact angle to be no less than the abovementioned lower limit, decrease in flatness of the epitaxial wafer EW due to the lift pin 5 embedded in the susceptor 2 can be inhibited.

Next, a range of the oxide film Ox, provided on the back surface W2 of the semiconductor wafer W in the oxide film forming step S1, to be removed in the etching step S2 is hereinafter described. As already described, the oxide film Ox, provided on the back surface W2 of the semiconductor wafer W, is removed except for in an outer peripheral portion of the semiconductor wafer W.

A reason that the oxide film Ox in the inner peripheral portion of the semiconductor wafer W is removed is because, if the oxide film Ox is present in a portion on the back surface W2 of the semiconductor wafer W positioned above the lift pin 5 embedded in the second concave portion 212 of the wafer placement portion 21 in a case where the semiconductor wafer W is placed on the wafer placement portion 21, flatness is decreased in the portion in question in the epitaxial wafer EW that has been manufactured. In other words, the oxide film Ox may be locally etched by inflow of process gas to the back surface W2 of the semiconductor wafer W, thereby resulting in decrease in flatness of the back surface W2 of the semiconductor wafer W. Therefore, the oxide film Ox provided on the back surface W2 of the semiconductor wafer W must be removed in a portion positioned above the lift pin 5.

A positional relationship between the lift pin 5 and the oxide film Ox is described hereinafter with reference to FIGS. 2 and 7. FIGS. 7A and 7B are diagrams showing a state where the semiconductor wafer W is placed on the susceptor 2, in which FIG. 7A is a plan view and FIG. 7B is a vertical cross-sectional view.

A plurality (three in the present embodiment) of lift pins 5 are provided in the second concave portion 212 in the wafer placement portion 21, with the same distance from a center of the susceptor 2. In other words, the plurality of the lift pins 5 are provided on the bottom face of the second concave portion 212 so that a virtual lift pin installation circle LC is concentric with the susceptor 2. In addition, the lift pins 5 are inserted into the through holes 22 provided in the second concave portion 212 so as to be ascendable and descendable. In other words, a plurality of through holes 22, into which the lift pins 5 for moving up and down the semiconductor wafer W are inserted, are provided on the bottom face of the second concave portion 212, on the lift pin installation circle LC that is concentric with the wafer placement portion 21.

Here, the diameter of the lift pin installation circle LC is smaller than the diameter of the hydrophobic portion Hp provided on the back surface W2 of the semiconductor wafer W. Hence, a portion positioned above the lift pin 5 is the hydrophobic portion Hp provided on the back surface W2 of the semiconductor wafer W. This can inhibit decrease in flatness of the epitaxial wafer EW due to presence of the oxide film Ox in the portion positioned above the lift pin 5.

Here, the oxide film Ox remaining in the outer peripheral portion of the back surface W2 of the semiconductor wafer W is a hydrophilic portion having hydrophilic properties. In the present embodiment, the hydrophilic portion consisting of the oxide film Ox is provided in a substantial region in the outer peripheral portion of the back surface W2 of the semiconductor wafer W, in order to prevent sticking between the susceptor 2 and the semiconductor wafer W. More specifically, the hydrophilic portion consisting of the oxide film Ox is preferably provided at least in a portion contacting the semiconductor wafer supporting portion 213 inside the wafer placement portion 21, on the back surface W2 of the semiconductor wafer W.

More specifically, the region in which the hydrophilic portion consisting of the oxide film Ox remains on the back surface W2 of the semiconductor wafer W is a region on the back surface W2 of the semiconductor wafer W, between a circle 5 mm inside the outer periphery of the semiconductor wafer W that is concentric with the semiconductor wafer W and the outer periphery of the semiconductor wafer W. In other words, the hydrophilic portion consisting of the oxide film Ox remains preferably in a region with a distance d shown in FIG. 6 being 5 mm.

To explain more specifically, the semiconductor wafer W of 300 mm in diameter (150 mm in radius) is taken as an example. In this case, a central portion of the lift pin 5, of which a head portion 51 is enlarged to be about 12 mm in diameter, is positioned about 114 mm away from the center, on the back surface W2 of the semiconductor wafer W. That is, the portion positioned above the lift pins 5 is a region from 108 to 120 mm away from the center of the semiconductor wafer W, on the back surface W2 of the semiconductor wafer W. In other words, the hydrophobic portion Hp, where the oxide film Ox is removed, is provided in a region of at least a radius of 120 mm from the center of the semiconductor wafer W. In addition, the hydrophilic portion consisting of the oxide film Ox is provided on the back surface W2 of the semiconductor wafer W, in a region from 145 to 150 mm away from the center of the semiconductor wafer W, in order to prevent sticking between the susceptor 2 and the semiconductor wafer W. A remaining region on the back surface W2 of the semiconductor wafer W, which is from 120 to 145 mm away from the center of the semiconductor wafer W, can be either the hydrophilic portion consisting of the oxide film Ox or the hydrophobic portion Hp.

Wafer Placing Step (S3)

Next, the wafer placing step S3 of the present embodiment is described. The wafer placing step S3 is performed after the etching step S2. In this step, the semiconductor wafer W is placed on the wafer placement portion 21 such that the back surface W2 of the semiconductor wafer W faces downward. Here, as already described, the semiconductor wafer W is placed on the wafer placement portion 21 such that the oxide film Ox, which is provided in the outer peripheral portion of the back surface W2 of the semiconductor wafer W, is in contact with the wafer supporting portion 213.

A method for placing the semiconductor wafer W on the wafer placement portion 21 is not particularly limited and various well-known methods can be adopted for placing the semiconductor wafer W.

Epitaxial Growth Step (S4)

The epitaxial growth step S4 is performed after the wafer placing step S3. The epitaxial growth is performed by introducing reactant gas to the inside of a reaction container 3 through a reactant gas supply pipe 331. Then the epitaxial growth is performed by growing, for example, silicon produced by pyrolysis or reduction of the reactant gas at a reaction rate of 0.5 to 6.0 μm/min on the main surface W1 of the semiconductor wafer W heated to high temperature of 1000 to 1200° C. The reactant gas is obtained by mixing $SiHCl_3$, which is a Si source, with hydrogen gas. Dopant gas is added to the reactant gas as necessary.

As a result, the epitaxial layer EP is grown on the main surface W1 of the semiconductor wafer W and the epitaxial wafer EW can be obtained.

After the epitaxial growth step S4, the next step is performed in a state where the oxide film Ox remains in the outer peripheral portion of the back surface W2 of the epitaxial wafer EW. Alternatively, after the epitaxial growth step, the oxide film Ox on the back surface W2 of the epitaxial wafer EW can be removed by cleaning using HF solution, BHF solution, DHF solution and the like. The epitaxial wafer EW without the oxide film Ox is thus manufactured.

According to the manufacturing method for an epitaxial wafer according to the present embodiment, the following effect is provided.

The manufacturing method for an epitaxial wafer according to the present embodiment uses a vapor phase growth system 1 that is provided with a susceptor 2, the susceptor 2 having on an upper face thereof a substantially round and concave shaped wafer placement portion 21, on which a semiconductor wafer W is placed and, on a bottom face thereof, a plurality of through holes 22 through which lift pins 5 that move the semiconductor wafer W up and down are inserted, on a lift pin installation circle LC that is concentric with the wafer placement portion 21, and includes: an oxide film forming step S1 in which a hydrophilic portion consisting of an oxide film Ox is formed on a back surface W2 of the semiconductor wafer W; an etching step S2 in which a hydrophobic portion Hp that exposes a back surface W2 of the semiconductor wafer W is provided by removing a portion of the oxide film Ox in a circular shape that is concentric with the semiconductor wafer W after the oxide film forming step S1; a wafer placing step S3 in which, after the etching step S2, the semiconductor wafer W is placed on the wafer placement portion 21 such that the back surface W2 of the semiconductor wafer W faces downward; and an epitaxial growth step S4 in which, after the wafer placing step S3, an epitaxial layer EP is grown on a main surface W1 of the semiconductor wafer W; and the diameter of the lift pin installation circle LC is smaller than the diameter of the hydrophobic portion Hp.

As a result, the oxide film Ox is present in the outer peripheral portion of the semiconductor wafer W, thereby avoiding sticking between the semiconductor wafer W and the susceptor 2 in the epitaxial growth step S4. This avoids distortion of the semiconductor wafer W due to difference in thermal expansion between the semiconductor wafer W and the susceptor 2 in a case where the sticking is present. In addition, since the oxide film Ox provided on the back surface W2 of the semiconductor wafer W is not present above the lift pin 5 embedded in the wafer placing portion 21, superior flatness of the epitaxial wafer EW manufactured can be maintained.

Furthermore, in the manufacturing method for an epitaxial wafer according to the present embodiment, the hydrophilic portion consisting of the oxide film Ox is provided at least in a portion contacting the wafer placement portion 21, on the back surface W2 of the semiconductor wafer W.

This prevents sticking between the susceptor 2 and the semiconductor wafer W since the semiconductor wafer W is always in contact with the susceptor 2 at the hydrophilic portion consisting of the oxide film Ox. This avoids distortion of the semiconductor wafer W due to difference in thermal expansion between the semiconductor wafer W and the susceptor 2 in a case where the sticking is present.

An embodiment of the present invention has been described in detail with reference to the drawings; however, the present invention is not limited thereto and can be changed and implemented as appropriate within the scope of an objective of the present invention.

For example, the wafer placement portion 21 of the susceptor 2 is not required to have the second concave portion 212. In other words, the wafer placement portion 21 can be a single-level concave portion. In this case, a lift pin and a through hole into which the lift pin is inserted are provided on a bottom face of the concave portion.

In addition, although silicon is exemplified as a semiconductor in the present embodiment, the semiconductor used in the present invention is not limited thereto.

EXAMPLES

The present invention is described in further detail hereinafter by means of examples; however, the present invention is not limited thereto.

Example 1

A p-type silicon wafer of 300 mm in diameter, which is double-side polished, was set on a single wafer processing cleaner. First, as the oxide film forming step, ozone water solution (20 ppm in concentration) was sprayed onto a main surface and a back surface of the silicon wafer at a feed rate of 1 SLM for 1 minute while rotating the silicon wafer at 1000 rpm, thereby forming an oxide film on the main surface and the back surface thereof. Next, as the etching step, hydrofluoric acid water solution (1% by mass in concentration) was sprayed onto the back surface at a feed rate of 1 SLM for 1 minute while rotating the silicon wafer at 10 rpm, thereby removing the oxide film formed on the back surface of the silicon wafer except for in an outer peripheral portion thereof. Thereafter, the main surface and the back surface of the silicon wafer were cleaned by spraying pure water thereonto. Spray nozzles of the ozone water solution and the hydrofluoric acid water solution were disposed in a substantially central portion of the silicon wafer, at a distance of 5 mm from the back surface of the silicon wafer.

In the abovementioned process, the oxide film on the back surface of the silicon wafer was removed except for in a region from 125 to 150 mm away from a center of the silicon wafer (in other words, region of 25 mm from an outer periphery of the silicon wafer). Water contact angle of a portion where the oxide film remained (a portion 148 mm away from the center) was no greater than 10° and water contact angle of a portion where the oxide film was removed (a portion 114 mm away from the center, where a lift pin on the susceptor was present) was 40°.

The silicon wafer thus obtained was placed on a wafer placement portion of the susceptor provided in an epitaxial growth apparatus such that the back surface thereof is faced downward, thereby growing an epitaxial layer on the main surface of the silicon wafer. Reactant gas obtained by mixing $SiHCl_3$, hydrogen gas, and $B_2H_6$ as a p-type dopant was introduced to the inside of a reaction container through a reactant gas supply pipe. The silicon wafer was heated to 1130° C. and an epitaxial layer of 3 μm in thickness was grown at a reaction rate of 2.5 μm/min.

Distortions in the outer peripheral portion on the back surface of the epitaxial wafer thus obtained were measured using SIRD (Scanning InfraRed Depolarization) (SIRD A300 manufactured by TePla). As a result, no distortion was found in the outer peripheral portion thereof.

In addition, flatness of the epitaxial wafer thus obtained was measured using WaferSight (manufactured by KLA-Tencor). As a result, superior flatness was confirmed and decrease in flatness due to presence of a lift pin was found to be prevented.

Example 2

The oxide film forming step and the etching step were performed in the same conditions except for conditions of the etching step, where rotating speed of the silicon wafer being 30 rpm and spraying time of the hydrofluoric acid water solution being 1 minute.

In the abovementioned process, the oxide film on the back surface of the silicon wafer was removed except for in a region from 145 to 150 mm away from a center of the silicon wafer (in other words, a region of 5 mm from an outer periphery of the silicon wafer). The water contact angle of a portion where the oxide film remained (a portion 148 mm away from the center) was no greater than 10° and the water contact angle of a portion where the oxide film was removed (a portion 114 mm away from the center, where a lift pin on the susceptor was present) was 40°.

The silicon wafer thus obtained was epitaxially grown in the same condition as that in Example 1, and distortions in the outer peripheral portion thereof and flatness thereof were evaluated. As a result, as in Example 1, no distortion was found in the outer peripheral portion thereof, and superior flatness thereof was confirmed.

Comparative Example 1

The oxide film forming step and the etching step were performed in the same conditions except for conditions of the etching step, where rotating speed of the silicon wafer was 50 rpm and spraying time of the hydrofluoric acid water solution was 10 minutes.

It was confirmed that the water contact angle of the whole back surface of the silicon wafer was no less than 40°, and the oxide film was completely removed in the abovementioned process.

The silicon wafer thus obtained was epitaxially grown in the same condition as that in Example 1, and distortions in the outer peripheral portion thereof and flatness thereof were evaluated. As a result, distortion was found in the outer peripheral portion of the back surface of the epitaxial wafer thus obtained, but flatness thereof was superior.

Comparative Example 2

The silicon wafer was epitaxially grown in the same condition as that in Example 1, except for the etching step not performed after the oxide film forming step, and distortions in the outer peripheral portion thereof and flatness thereof were evaluated. As a result, no distortion was found in the outer peripheral portion of the back surface of the epitaxial wafer thus obtained, but flatness thereof was poor in a portion where the lift pin was present.

According to the results, it was indicated that distortions in the outer peripheral portion of an epitaxial wafer can be prevented while avoiding decrease in flatness in a portion where a lift pin was present, by performing pretreatment forming an oxide film only in an outer peripheral portion of a silicon wafer before epitaxial growth.

What is claimed is:

1. A manufacturing method for an epitaxial wafer using a vapor phase growth system that is provided with a susceptor, the susceptor having on an upper face thereof a substantially round and concave shaped wafer placement portion, on which a semiconductor wafer is placed and, on a bottom face thereof, a plurality of through holes through which lift pins that move the semiconductor wafer up and down are inserted, on a lift pin installation circle that is concentric with the wafer placement portion,
comprising: an oxide film forming step in which a hydrophilic portion consisting of an oxide film is formed on a back surface of the semiconductor wafer;
an etching step in which a hydrophobic portion that exposes a back surface of the semiconductor wafer is provided by removing a portion of the oxide film in a circular shape that is concentric with the semiconductor wafer, after the oxide film forming step;
a wafer placing step in which the semiconductor wafer is placed on the wafer placement portion so that the back surface of the semiconductor wafer faces downward after the etching step; and
an epitaxial growth step in which an epitaxial layer is grown on a main surface of the semiconductor wafer after the wafer placing step,
wherein the diameter of the lift pin installation circle is smaller than the diameter of the hydrophobic portion.

2. The manufacturing method for an epitaxial wafer according to claim 1, wherein the hydrophilic portion is provided on the back surface of the semiconductor wafer, at least in a site that is in contact with the wafer placement portion.

3. The manufacturing method for an epitaxial wafer according to claim 1, wherein: the wafer placement portion is composed of a first concave portion that has a round shape and is concave downward from the upper face of the susceptor, and a second concave portion that is concave downward from a bottom face of the first concave portion and has a round shape that is concentric with and has a smaller diameter than the first concave portion;
a semiconductor wafer supporting portion for supporting the semiconductor wafer on the bottom face of the first concave portion is formed at a position on an outer periphery side of the second concave portion;
the through holes are provided on a bottom face of the second concave portion;
and in the wafer placing step, the semiconductor wafer is placed on the wafer supporting portion so that an outer peripheral portion of a back surface of the semiconductor wafer is supported by the semiconductor wafer supporting portion.

4. The manufacturing method for an epitaxial wafer according to claim 2, wherein: the wafer placement portion is composed of a first concave portion that has a round shape and is concave downward from the upper face of the susceptor, and a second concave portion that is concave downward from a bottom face of the first concave portion and has a round shape that is concentric with and has a smaller diameter than the first concave portion;
a semiconductor wafer supporting portion for supporting the semiconductor wafer on the bottom face of the first concave portion is formed at a position on an outer periphery side of the second concave portion;
the through holes are provided on a bottom face of the second concave portion;
and in the wafer placing step, the semiconductor wafer is placed on the wafer supporting portion so that an outer peripheral portion of a back surface of the semiconductor wafer is supported by the semiconductor wafer supporting portion.

5. The manufacturing method for an epitaxial wafer according to claim 1, wherein the hydrophilic portion is provided on the back surface of the semiconductor wafer at least between a circle that is concentric to the semiconductor wafer, located 5 mm inward from an outer peripheral edge thereof, and the outer peripheral edge.

6. The manufacturing method for an epitaxial wafer according to claim 2, wherein the hydrophilic portion is provided on the back surface of the semiconductor wafer at least between a circle that is concentric to the semiconductor wafer, located 5 mm inward from an outer peripheral edge thereof, and the outer peripheral edge.

7. The manufacturing method for an epitaxial wafer according to claim 3, wherein the hydrophilic portion is provided on the back surface of the semiconductor wafer at least between a circle that is concentric to the semiconductor wafer, located 5 mm inward from an outer peripheral edge thereof, and the outer peripheral edge.

* * * * *